(12) United States Patent
Masson et al.

(10) Patent No.: US 8,018,202 B2
(45) Date of Patent: Sep. 13, 2011

(54) CIRCUIT FOR MEASURING AND CONTROLLING DIFFERENTIAL VOLTAGES

(75) Inventors: Thierry Masson, Varces (FR); Pierre-Adrien Pinoncely, Grenoble (FR); Laurent Espuno, St Nizier du Moucherotte (FR); Sébastien Lebreton, Fontanil Cornillon (FR); Michel Durr, La Buisse (FR)

(73) Assignee: E2V Semiconductors (FR)

( * ) Notice: Subject to any disclaimer, the term of this patent is extended or adjusted under 35 U.S.C. 154(b) by 348 days.

(21) Appl. No.: 12/282,534

(22) PCT Filed: Mar. 29, 2007

(86) PCT No.: PCT/EP2007/053014
§ 371 (c)(1),
(2), (4) Date: Jan. 16, 2009

(87) PCT Pub. No.: WO2007/113199
PCT Pub. Date: Oct. 11, 2007

(65) Prior Publication Data
US 2009/0128095 A1    May 21, 2009

(30) Foreign Application Priority Data
Mar. 31, 2006    (FR) .................................... 06 02819

(51) Int. Cl.
*H02J 7/00*    (2006.01)

(52) U.S. Cl. ........................................ 320/136; 320/116

(58) Field of Classification Search .................. 320/136, 320/116
See application file for complete search history.

(56) References Cited

U.S. PATENT DOCUMENTS

| 6,094,053 | A | | 7/2000 | Harvey | |
| 6,157,171 | A | * | 12/2000 | Smith | 320/133 |
| 6,424,058 | B1 | * | 7/2002 | Frech et al. | 307/109 |
| 2005/0242776 | A1 | * | 11/2005 | Emori et al. | 320/116 |

FOREIGN PATENT DOCUMENTS

| DE | 19751987 A | 5/1999 |
| EP | 1067393 A | 1/2001 |
| WO | 9927628 A1 | 6/1999 |

* cited by examiner

*Primary Examiner* — Patrick Assouad
*Assistant Examiner* — M'Baye Diao
(74) *Attorney, Agent, or Firm* — Lowe Hauptman Ham & Berner, LLP

(57) ABSTRACT

The invention relates to circuits for managing differential voltages in series. To individually control the differential voltages of voltage sources in series, there is provided an integrated control circuit for a set of N sources in series. This circuit comprises N discharge control and measurement cells which are each produced in a separate well, insulated from the substrate and from the other wells. The cells are linked to the circuits formed in the substrate by level translation circuits having a part inside the well and a part outside the well. These circuits use transistors withstanding voltages of several tens of volts. The integrated circuits may be cascaded on an SPI bus if one wishes to control a group of k.N sources with k>1.

15 Claims, 5 Drawing Sheets

CIRCUIT FOR MEASURING AND CONTROLLING DIFFERENTIAL VOLTAGES

CROSS REFERENCE TO RELATED APPLICATIONS

The present Application is based on International Application No. PCT/EP2007/053014, filed on Mar. 29, 2007, which in turn corresponds to French Application No. 06/02819 filed on Mar. 31, 2006, and priority is hereby claimed under 35 USC §119 based on these applications. Each of these applications are hereby incorporated by reference in their entirety into the present application.

FIELD OF THE INVENTION

The invention relates to the management of a power energy source composed of a group of numerous sources in series. The sources are connected in series so as to be able to provide a much higher voltage than the voltage that can be provided by an individual elementary source.

BACKGROUND OF THE INVENTION

A typical application of the invention relates to the management of a battery of an electric vehicle or hybrid vehicle (vehicle associating an electric motor and an engine).

For this type of application at very high energy consumption, batteries having a large storage capacity as well as low dimensions and weight, such as lithium/ion batteries, are required; these batteries provide a voltage which is only a few volts, although one wishes to use electric motors operating at several tens, or indeed several hundreds of volts; this is why several tens of elementary batteries are placed in series, for example 60 batteries whose voltages can vary from 2.2 to 5 volts depending on their state of charge; the 60 batteries can provide a voltage of 130 to 300 volts.

These batteries are fragile and their lifetime depends on their conditions of use; it is necessary that they operate in a clearly determined range of voltages, neither too high nor too low, and it is necessary that they all operate and age in the same manner, failing which the battery which ages quickest will cause a malfunction, or indeed a destruction, of the whole set. Moreover, to reduce the risks of explosion, it is necessary to prevent these batteries from being overly charged. All this gives rise to the need to tightly control the voltage of each elementary battery of the set in series, and optionally the need to individually discharge an overly charged battery.

The control of the individual voltages must be very precise; typically the voltage must be measured to within a few millivolts. This control is carried out on the basis of battery management electronic circuits, and the function of these circuits is firstly to individually measure the voltage of each battery, and thereafter to discharge any batteries that might exhibit too high a voltage in absolute terms (because of the risk of explosion) or relative terms with respect to the other batteries (to avoid different aging of the various batteries).

However, individual control of numerous batteries in series is difficult, notably because the integrated circuits with which it would be necessary to carry out this control are not adapted for operating at voltages of several tens of volts. Now, it is necessary to be able to control not only the batteries closest to the lower potential of the set in series, but also those which are in the middle and those which are closest to the upper potential, knowing that the interval between the lower potential and the upper potential may attain several hundred volts. Even if a set of 60 batteries is decomposed into 5 modules of 12 batteries, by appending an integrated control circuit to each module, insulated from the other control circuits, the problem of the high voltage levels (60 volts for example) remains critical, since it is difficult to measure a differential voltage of a few volts to within a few millivolts with a common-mode voltage which can vary between 0 and 60 volts. Even excellent common-mode rejection leaves measurement errors of several millivolts. Additionally, the instrumentation amplifiers cannot be made with transistors supporting such voltages, since these transistors are particular components (so-called "drift mos" transistors) which do not lend themselves to the production of circuits for fine measurement. This difficulty of producing measurement circuits also exists for the production of discharge control circuits: notably if one wishes to control the discharge of the battery at constant current, an electronic circuit is required which operates even for common-mode voltages that are mutually very different. Finally, for the same reasons of the presence of high voltages, even if the group of batteries is divided into five modules of 12 batteries, there is still the need for a global management circuit for the five modules and which has to communicate with individual control circuits associated with each module, and therefore associated with mutually very different operating voltages.

A way of solving the problem of the variable common-mode voltages could consist in using divider bridges between the terminals of a battery to be measured and a general earth, to reduce the common-mode voltage to a level of a few volts, for each of the individual batteries, before applying the differential voltage to a multiplexer and an analog-digital converter. The latter circuit elements can then form part of a standard technology low-voltage, and therefore relatively inexpensive, integrated circuit. But the final accuracy becomes very poor since the divider bridges merely introduce additional errors on account of their natural inaccuracy and especially on account of the division ratio which multiplies the measurement errors by the division ratio. Additionally the current consumption of the divider bridges is continuous, which would not be acceptable in an application to an electric vehicle, and moreover this consumption would be variable from one battery to another, which would not be acceptable either. Additional circuits would then be necessary to cut off the power supply to the divider bridges, which would render the whole set more complex.

SUMMARY OF THE INVENTION

To alleviate these drawbacks, the present invention proposes an electronic circuit for controlling a group of k.N batteries in series, k an integer greater than or equal to 1, and N an integer greater than 1, comprising k integrated control circuit microchips each associated with a sub-group of N batteries in series, characterized in that:
  each control microchip comprises a substrate connected to an endmost terminal of the set of N batteries, and a control circuit formed in the substrate,
  each microchip comprises N voltage measurement and discharge control cells, each supplied by a respective battery and providing a numerical measurement of the voltage of the battery, each cell being able to receive from the control circuit a control command ordering partial discharge of the battery and to establish a current discharge path in parallel with the battery on receipt of this command,
  each cell, with the exception optionally of a first cell of the sub-group of N batteries, is produced inside a respective well insulated from the substrate of the microchip and insulated from the wells corresponding to the other cells, this well being brought to the potential of one of the terminals of the battery associated with the cell, with each cell is associated a voltage level translation circuit so as to allow the transmission of logic levels between a cell supplied through a battery and the control circuit formed in the substrate, the level translation circuit comprising a part formed in the well associated with the cell and a part formed in the substrate.

The wells are formed for example by diffusions in the substrate, these diffusions having an opposite type of conductivity from the substrate. They can also be made by separating semiconducting zones in a substrate of SOI (silicon on insulant) type, each well being delimited at its lower part by a buried insulating layer and at its periphery by a diffused or insulating separation zone.

This architecture is applicable in the case where the number N of batteries makes it possible to obtain with a single integrated circuit microchip (k=1) the desired global voltage: for example 60 volts with 12 batteries, and a single integrated circuit microchip for managing the 12 batteries. In this case, the control circuit formed in the substrate of the microchip performs all the operations for providing commands for measurement, receiving measurement values, processing these values, providing discharge commands. But the control circuit can also receive the measurement commands and the discharge commands from a separate integrated circuit (for example a simple programmed microprocessor) and transmit the measured numerical values, the processing of the values being performed by the separate integrated circuit.

The architecture is also applicable in the case where the desired voltage is higher and requires k modules (k>1) of batteries with k control circuit microchips. In this case the preferred solution according to the invention consists in making provision for the microchips to be linked in cascade by a bus of SPI (Serial Parallel Interface) type in which the bus receives the commands from an additional integrated circuit (general control circuit, for example a programmed microprocessor), transmits these commands in cascade to the various microchips by successively entering the intermediate microchips in the cascade, gathers the numerical values and transmits them to the general control circuit; each microchip comprises three input/output terminals (clock, input, output) linked to a preceding microchip and three other input/output terminals linked to a succeeding microchip; the first microchip is linked to the general integrated control circuit.

The level translation circuits comprise parts for lowering the common-mode voltage and parts for raising the common-mode voltage of the logic signals. These parts use transistors supporting high voltages on account of the particular construction of their channel (transistors called "drift mos").

When k is greater than 1, k sets of N batteries are placed in series, and k integrated circuit microchips are connected to the terminals of the k sets. These microchips are connected in cascade by a control bus of SPI (standardized "Serial/parallel/interface" bus) type. Each microchip then comprises three connection terminals for connection to an upstream microchip and three connection terminals for connection to a downstream microchip, each microchip acting as slave in relation to a preceding microchip and as master in relation to a succeeding microchip, with a view to cascade connection of the various microchips for the control of several sets of N batteries. The SPI bus transmits the commands and gathers the individual battery voltage numerical measurements.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DESCRIPTION OF PREFERRED EMBODIMENTS

Figure 1:
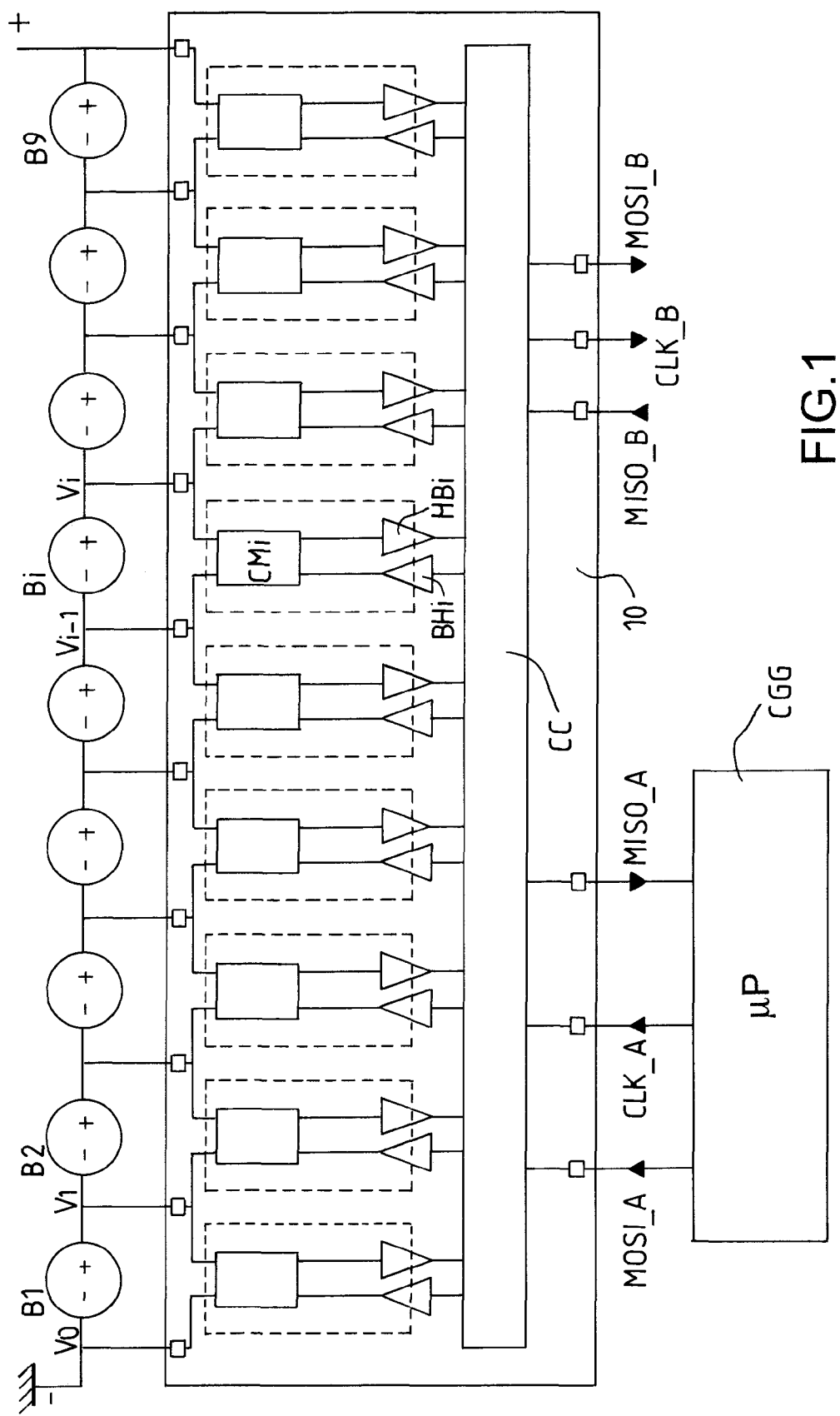
FIG. 1 represents the general architecture of a module of batteries with its control circuit according to the invention.

In FIG. 1 is seen a set of nine batteries in series, B1 to B9; the batteries are for example lithium/ion batteries that are able to operate correctly when they are charged between 2.2 volts and 5 volts each, so that the total voltage provided by the set is between 20 volts and 45 volts. These numbers are given by way of example; it would be equally possible to have 8 or 12 batteries in series; however, it is understood that integrated circuit technology limits this number since it will be necessary for certain parts of the control circuit to support the maximum voltage of the set in series.

An integrated circuit microchip 10 serving to ensure the control of the individual batteries of the set is associated with this set of N=9 batteries. If the voltage to be generated is more than 60 volts, several sets in series of N batteries will be used, for example k=5 sets in series, that is to say k.N=45 batteries in series if N=9, to obtain a voltage varying from 100 to 225 volts. In this case, five integrated circuit microchips will be used for the control of the individual batteries, each microchip being associated with a respective set of N batteries. The construction of the control circuit in this case will be returned to later.

On the control microchip 10 is found a respective electronic circuitry cell associated with each battery Bi of rank i. This cell CMi is a cell for measuring the voltage of the battery and for controlling the discharging of the battery. There are therefore N cells CM1 to CM9. Each measurement and control cell CMi of rank i is linked to two respective connection pads of the microchip, and these pads are linked to the terminals of the associated battery; they receive potentials $V_{i-1}$ and $V_i$ from these terminals. A cell of intermediate rank between 1 and 9 therefore shares a connection pad with an adjacent cell of lower rank and another pad with an adjacent cell of higher rank.

The battery Bi associated with a cell CMi serves as power supply source for the cell as will be detailed further on. Consequently, the connections represented between the cell and the associated battery play at one and the same time the role of electrical supply inputs and the role of measurement inputs since the cell serves to measure the voltage of the battery but uses this voltage as supply voltage.

All the cells are linked to a control circuit CC which forms part of the microchip and which has the following functions: it provides battery voltage measurement commands to the cells; it gathers the voltage values measured by each cell; it utilizes them or transmits them to another integrated circuit for utilization; it provides a cell with a command to discharge the associated battery if the utilization shows that this battery has too high a voltage.

The voltage measurement values are provided to the circuit CC in digital form; this implies that a respective analog-digital converter is provided in each cell.

The measurement cells establish a differential measurement of the voltage $V_i$-$V_{i-1}$ present between the terminals of a battery, but the common-mode voltage is variable from one cell to another since it depends on the position of the battery in the series of N. Consequently the measurement circuits provide differential values with a variable common-mode voltage; for simplicity it will be considered hereinafter that the common-mode voltage of the circuit CMi is the voltage $V_{i-1}$, that is to say the low potential of the power supply of this circuit. The lowest common-mode voltage is $V_0$, the lowest potential of the set of N batteries in series.

The common-mode voltage varying from one cell to another is very troublesome for the control circuit CC which must utilize or transmit the value measured by the cell and which must additionally provide commands to the cell. This is why a high level to low level translation circuit HBi is provided between the output of the cell CMi (output which provides a numerical measurement value) and a respective input of the control circuit CC. This circuit reduces the numerical value measured in the presence of a high common-mode voltage (in proportion with the rank of the battery in the series of N) to an identical numerical value but which bears a low common-mode voltage ($V_0$), the same for all the cells. The numerical value measured, with low common-mode voltage, becomes usable by the circuit CC.

In the same manner, so that a command provided (in digital form) to a cell by the control circuit CC can be utilized by the cell CMi, it is necessary to toggle the logic levels arising from the circuit CC (with common-mode voltage $V_0$) to a level where the common-mode voltage corresponds to the power supply of the cell, therefore to a level $V_{i-1}$ which corresponds to the rank of the associated battery. A level translation circuit, BHi is therefore associated with the cell CMi.

To separate the electronic functions which work at low common-mode voltage, notably the control circuit CC, from the functions which work at variable common mode from one cell to another, there is provision for the circuit CC to be produced directly in the substrate of an integrated circuit, while the measurement cells CM1 to CM9 are each produced in a respective semiconductor well insulated from the substrate and having its potential equal to that of one of the terminals of the battery connected to this cell. The wells are represented by a dashed line surrounding each cell; the level translation circuits associated with a cell each have a part in the well and a part outside the well, this being symbolized in the figure by the fact that the dashed line passes through the middle of these level translation circuits.

Finally, represented in FIG. 1 is another integrated circuit microchip CGG, which is a global management circuit (in practice a programmed microprocessor), which serves essentially in the case where the number of batteries to be controlled is much greater than 9 or 12 and requires a cascade of several integrated control circuits such as the microchip 10. This point will be returned to further on, but it may be stated forthwith that the global management circuit communicates with the first control microchip and that the control microchips each communicate with the preceding microchip and with the succeeding microchip, in such a manner that the global management circuit can give commands to any integrated control circuit and receive measurements therefrom. Three communication terminals CLK_A, MOSI_A, MISO_A are provided upstream of each microchip (for communication with the preceding microchip or with the global management microchip CGG), and three communication terminals downstream (intended for the succeeding microchip) CLK_B, MOSI_B, MISO_B. Other communication terminals can of course be provided as a function of requirements, for example a microchip selection terminal making it possible to dispatch a signal to the microchips by which they recognize one another as recipient of a message which is to follow.

Figure 2:
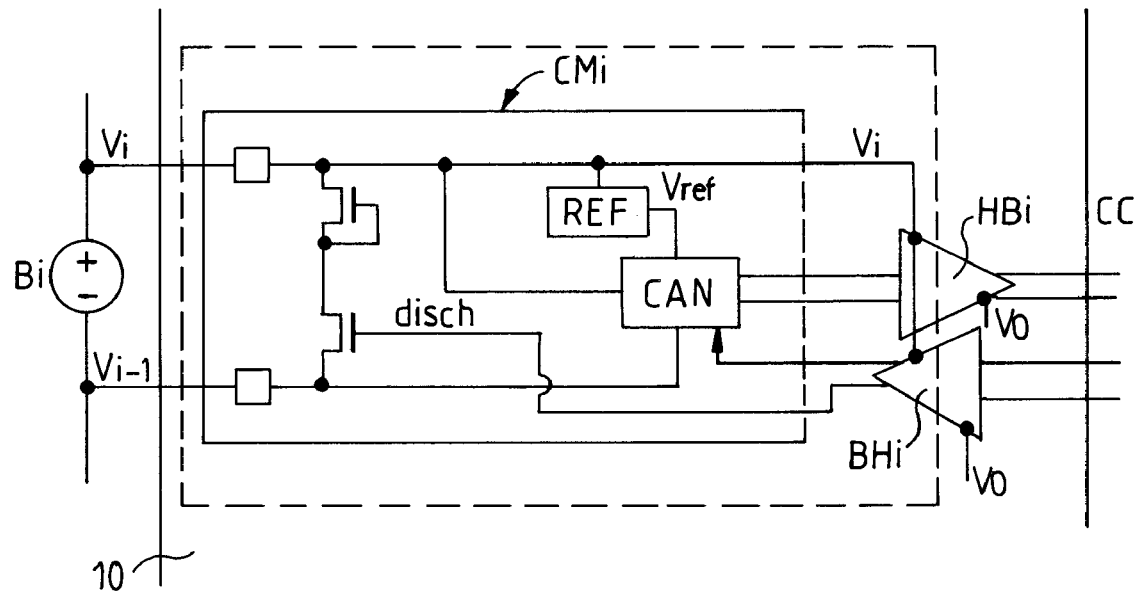
FIG. 2 represents a simple diagram of a discharge control and measurement cell.

FIG. 2 represents an exemplary block diagram of a battery voltage measurement and discharge control cell CMi, in a simplified version. The cell is connected to a battery Bi of rank i of the set of batteries in series and receives the voltages $V_{i-1}$ and $V_i$.

The cell CMi comprises an analog-digital converter ADC which provides numerical voltage measurements to the level translation circuit HBi.

The converter ADC receives as voltage to be converted the differential voltage $V_i$-$V_{i-1}$ of the battery Bi; it additionally receives a reference voltage Vref of a voltage reference circuit REF; the voltage Vref is defined differentially with respect to the low potential $V_{i-1}$ corresponding to this cell. The level translation circuit BHi provides the converter ADC with a conversion command and the converter provides a battery voltage measurement value in response to this command.

The level translation circuit BHi can additionally provide, originating from the control circuit CC, a discharge command (disch) applied to a discharge circuit of the battery, forming part of the circuit CMi. The discharge circuit is disposed between the terminals of the battery and makes it possible to discharge the battery for a time defined by the duration of the discharge command. The discharge is preferably at constant current. For simplicity the discharge circuit has been represented in the form of a set of two transistors in series, one of which serves as discharge control (activated by the disch command) and the other serves as resistor defining the value of the discharge current. The discharge command disch is provided by the control circuit CC, on the basis of instructions provided by the microprocessor CGG when the measurement of the battery voltage shows that this voltage is too high absolutely or relatively. The discharge commands can be provided in the form of repeated short pulses, alternated with new battery voltage measurements until the battery voltage has the value defined by the microprocessor CGG.

The set of elements of the cell CMi is supplied via the energy of the battery, from the terminals $V_i$ and $V_{i-1}$ of the battery. The level translation circuits are supplied, as will be detailed further on, between the terminal $V_i$ (the most positive terminal for this cell) and the potential $V_0$ of the substrate of the integrated circuit 10 (the most negative potential of the first battery of the group of N batteries). If there are several integrated circuits 10 in cascade, each corresponding to a sub-group of N batteries, the substrate potentials are all different and equal to the most negative potential of the respective sub-group of batteries.

Figure 3:
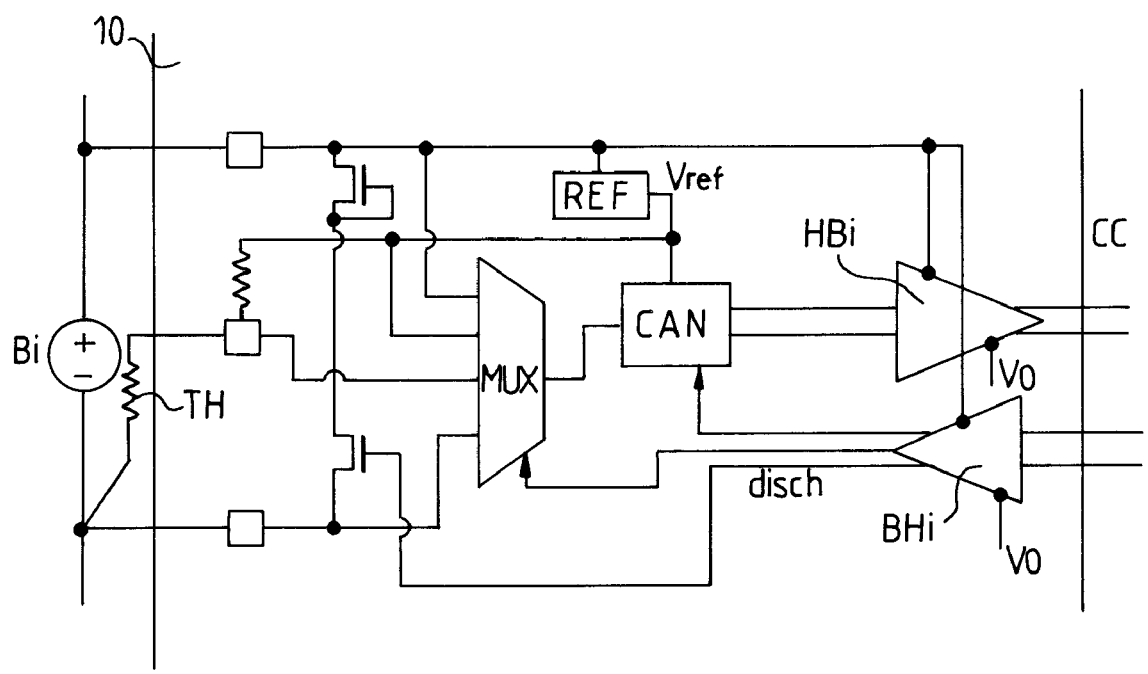
FIG. 3 represents another diagram of a discharge control and measurement cell.

FIG. 3 represents a somewhat more complex example of a discharge control and measurement circuit. In this version, the analog-digital converter ADC can measure not only the battery voltage, but also voltage values serving for calibration. Specifically, it is recalled that one wishes to measure the battery voltage with high precision (a few millivolts) and calibration operations may be necessary to limit the errors. For this purpose, a multiplexer MUX, which receives several voltage values and which can transmit one or the other of these values to the converter with a view to their measurement, is provided upstream of the converter ADC.

The voltage values that the converter can measure are:
the differential voltage $V_i - V_{i-1}$ of the battery;
a zero differential voltage $V_{i-1} - V_{i-1}$ which makes it possible to determine a shift value (or offset) of the converter, that is to say the conversion error which implies that a zero voltage at the input gives a nonzero numerical value at the output of the converter;
the reference voltage Vref, defined differentially with respect to the voltage $V_{i-1}$; this measurement makes it possible to calibrate the gain of the converter;
and finally, a voltage Vtemp representative of the temperature of the battery.

The voltage representative of the temperature is obtained for example with the aid of a thermistor TH glued to the battery and connected to a specific terminal of the integrated circuit (a temperature measurement terminal for each cell CMi). The thermistor is supplied through a resistor connected to the reference voltage Vref so as to constitute a divider bridge whose midpoint is linked to the multiplexer.

The numerical level translation circuit BHi provides the cell with commands destined for the multiplexer (choice of voltage to be measured), destined for the converter (conversion command), and destined for the discharge circuit (disch command); it can also provide the whole of the cell with an order to pass to standby mode with reduced power consumption, on condition that the cell is equipped with means for cutting off the elements which consume energy during use.

Figure 4:
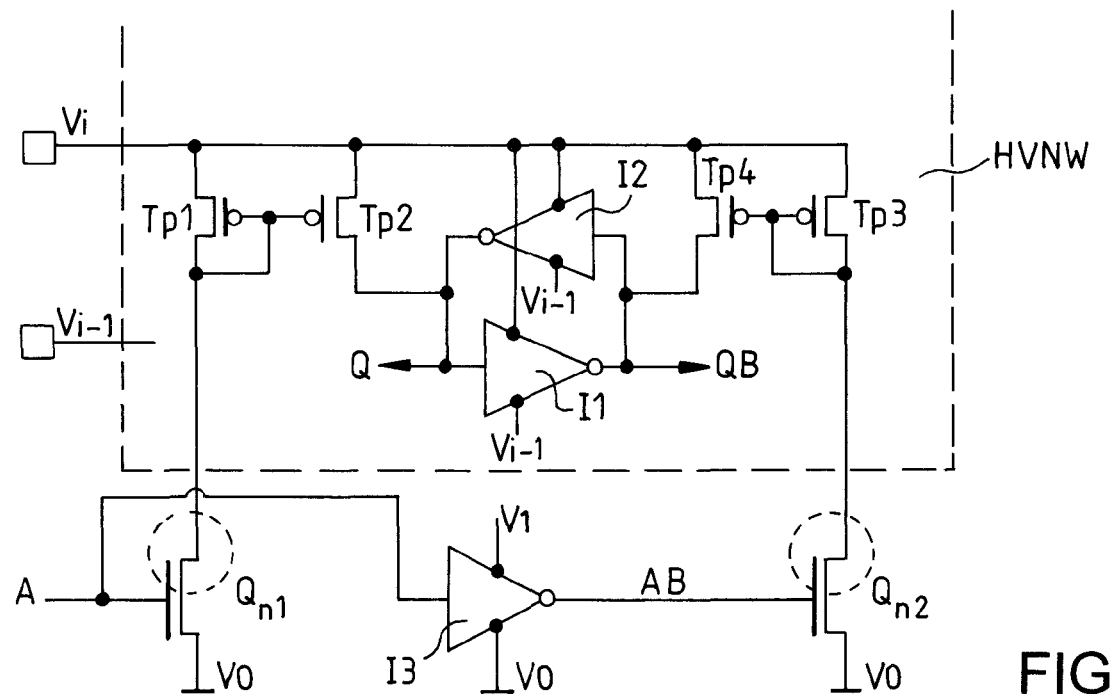
FIG. 4 represents a diagram of a low level to high level translation circuit.

FIG. 4 represents an exemplary numerical voltage level translation circuit BHi making it possible to convert a logic level obtained by reference to the low potential $V_0$ of the set of N batteries in series into a logic level obtained by reference to the low potential $V_{i-1}$ of the battery Bi of rank i. The potential $V_0$ is the potential of the substrate of the integrated circuit 10. In the example of FIG. 4, it is considered that there is a single logic level bit to be converted, this bit being represented by a value A; if several bits are necessary (parallel rather than series operation), then as many similar circuits are used.

The circuit BHi of FIG. 4 comprises two parts: a part formed directly in a doped substrate of type P and a part formed in a well HVNW of weakly doped N type, brought to the potential $V_{i-1}$ of the battery Bi. The well is represented by a dashed rectangle; this well is the same as the well in which the whole of the measurement and control cell CMi associated with the battery Bi is formed (a respective well for each cell). The doping N of the well is chosen so as to ensure a voltage withstand of several tens of volts, typically 30 volts, at the terminals of the well/substrate inverse junction.

The level translation circuit comprises:
ordinary circuit elements capable of supporting a low voltage (for example 5 volts), such as the transistors T1, T2, T3, T4, and the inverters I1, I2, all formed inside the well and supplied between the voltages $V_{i-1}$ and $V_i$, of the battery Bi;
ordinary circuit elements capable of supporting a low voltage, such as the inverter I3, formed directly in the substrate of the integrated circuit 10 and supplied between the voltage $V_0$ and the voltage $V_1$ of the first battery B1 of the set of N batteries;
and finally circuit elements with enhanced voltage withstand, capable of supporting voltages of several tens of volts, such as the NMOS transistors Q1 and Q2, formed directly in the substrate of the integrated circuit 10 but comprising a channel of particular configuration allowing the desired voltage withstand.

The particular channel configuration of the high-voltage NMOS transistors preferably uses, as will be seen, a division of channel between a weakly doped P type region adjoining the source and forming part of the substrate and a weakly doped N type region adjacent to the drain and formed by a well of type N diffused in the substrate; this N region has been represented in the form of a symbolic dashed circle in FIG. 4. This type of transistor is known by the name "drift mos".

The exemplary circuit given in FIG. 4 comprises a high-voltage NMOS transistor Qn1 whose base receives the logic level A between 0 and 5 volts, a PMOS transistor Tp1 mounted as a diode, in series with the transistor Qn1 and linked to the positive terminal, at $V_i$, of the battery Bi, a PMOS transistor Tp2 mounted as a current mirror of the transistor Tp1, having its source at $V_i$ and its drain linked to the input of an inverter I1. A second inverter I2 is looped back inversely between the output and the input of I1 so as to confirm the logic state Q present at the input of I1. The inverters I1 and I2 are supplied between $V_{i-1}$ and $V_i$ and the level Q is therefore referenced at low-voltage with respect to $V_{i-1}$.

When the logic level A passes from the low level (at $V_0$) to the high level (at $V_1$ the high potential of the first battery), the transistor Qn1 becomes conducting and draws down the gate potential of the transistor Tp1 and of the transistor Tp2. The transistor Tp2 becomes conducting; the input level Q of the inverter I1 changes state and passes to the high level (at $V_i$). The inverter I2 confirms this toggling and maintains the logic level Q at the high level (at $V_i$).

For the change of state in the opposite direction, a setup is provided that is identical to the setup of Qn1, Tp1 and Tp2 but controlled by a level AB complementary to the level A. This complementary level is obtained by an inverter I3 formed in the substrate and supplied between $V_0$ and $V_1$ (first battery B1 of the set). The inverter I3 receives the logic level A as input and provides the complementary level AB. This level is applied to a high-voltage NMOS transistor Qn2 identical to the transistor Q1. A set of PMOS transistors Tp3 and Tp4, mounted like Tp1 and Tp2, plays a symmetric role to that of the set Tp1, Tp2 but, while the drain of Tp2 is linked to the input of I1 to provide the logic level Q, the drain of Tp4 is linked to the input of I2 to provide the complementary logic level QB, between $V_{i-1}$ (low level) and $V_i$ (high level).

It is therefore understood that the high-voltage transistors Qn1 and Qn2 form the link between the circuit elements supplied between the voltages $V_0$ and $V_1$ (in the substrate of the integrated circuit) and the circuit elements supplied between the voltages $V_{i-1}$ and $V_i$ (in the well HVNW).

Figure 5:
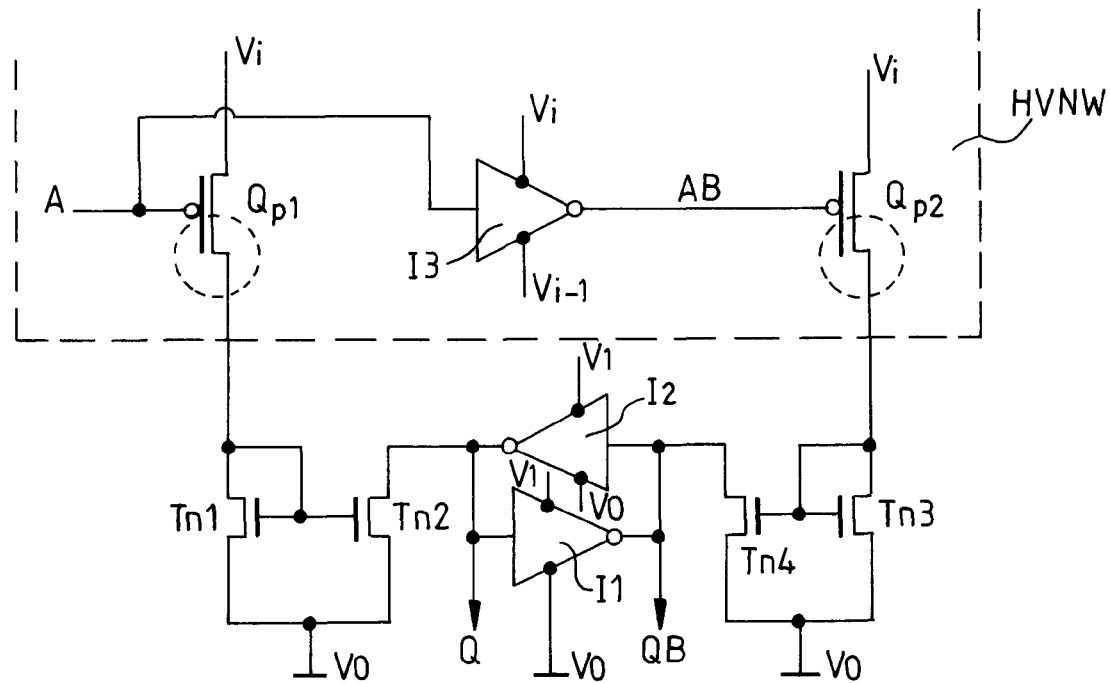
FIG. 5 represents a diagram of a high level to low level translation circuit.

FIG. 5 represents a numerical level translation circuit HBi, which operates in the inverse direction to the previous one and makes it possible to transform a logic signal A whose logic levels are between $V_{i-1}$ and $V_i$, into a logic signal Q whose logic levels are between $V_0$ and $V_1$. We shall not enter into details: the electrical diagram is exactly complementary to the diagram of FIG. 4; the high-voltage transistors are now PMOSs Qp1 and Qp2 and not NMOSs; their source is connected to $V_i$ and not to $V_0$; the transistors Tn1, Tn2, Tn3, Tn4, mounted like the transistors Tp1 to Tp4, are NMOSs, their source is connected to $V_0$ and not $V_i$; the inverters I1 and I2 are supplied between $V_0$ and $V_1$ and not $V_{i-1}$ and $V_i$; the inverter I3 is supplied between $V_{i-1}$ and $V_i$, and not $V_0$ and $V_1$.

In addition to this inversion of polarities and of voltage levels, the essential differences with the diagram of FIG. 4 are the following:

this time it is the elements Tn1, Tn2, Tn3, Tn4, I1, I2 which are formed directly in the substrate, and the elements Qp1, Qp2, and I3 which are formed in the well HVNW; this well is the same as that which contains all the circuit elements of the measurement cell CMi, therefore the same as that which contains the circuit BHi;

the high-voltage transistors comprise a channel of particular configuration allowing the desired voltage withstand, and this configuration preferably uses a division of channel between a weakly doped N type region adjoining the source and forming part of the well HVNW and a weakly doped P type region formed inside the well HVNW and adjacent to the drain; this P region has been represented in the form of a symbolic dashed circle in FIG. 5.

Figure 6:
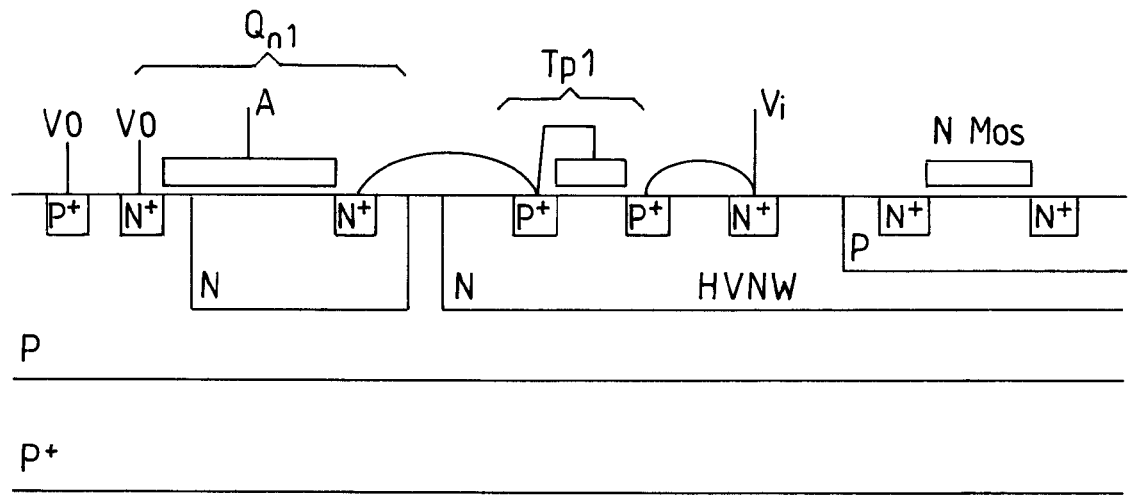
FIGS. 6 and 7 represent sections through structures of circuits of FIGS. 4 and 5 respectively.

FIG. 6 schematically represents an integrated circuit section illustrating the way in which the logic level translation circuit BHi is produced in practice. The integrated circuit 10 is formed for example in a substrate of type P+ comprising an epitaxied active layer of type P at its upper part. The figure is not to scale. The circuit elements formed in this substrate, for example the elements of the control circuit CC are not represented. They are all supplied between the voltage $V_0$ and the voltage $V_1$ of the first battery B1. The substrate is brought to the potential $V_0$, for example by virtue of a contact formed on a local surface diffusion of type P+. A diffused deep well HVNW, of type N, contains all the circuit elements of the measurement cell CMi associated with the battery Bi; it is brought to the potential $V_i$ by a contact on a local surface diffusion of type N+. PMOS transistors such as the transistor Tp1 of FIG. 4 are formed in this well. NMOS transistors (for example for the inverters I1 and I2 which are based on PMOSs and NMOSs) can be produced inside a diffused well P inside the well HVNW. The transistor Qn1 corresponding to the transistor Qn1 of FIG. 4, comprises a source of type N+ diffused in the substrate and linked to the potential $V_0$, and a drain formed by a diffusion of type N+ inside a well of type N which can be similar, in terms of doping and depth, to the diffusion of the well HVNW, but which does not form part of the latter; this channel well of Qn1 has a boundary situated under the gate of the transistor between the source region and the drain region; it leaves, under this gate, a channel region of type P adjacent to the source. The channel of this high-voltage transistor Qn1 (of "drift mos" type), overlapped by an insulated gate, therefore in a sense comprises two parts: a substrate part of type P adjacent to the source and a part of type N adjacent to the drain.

Figure 7:
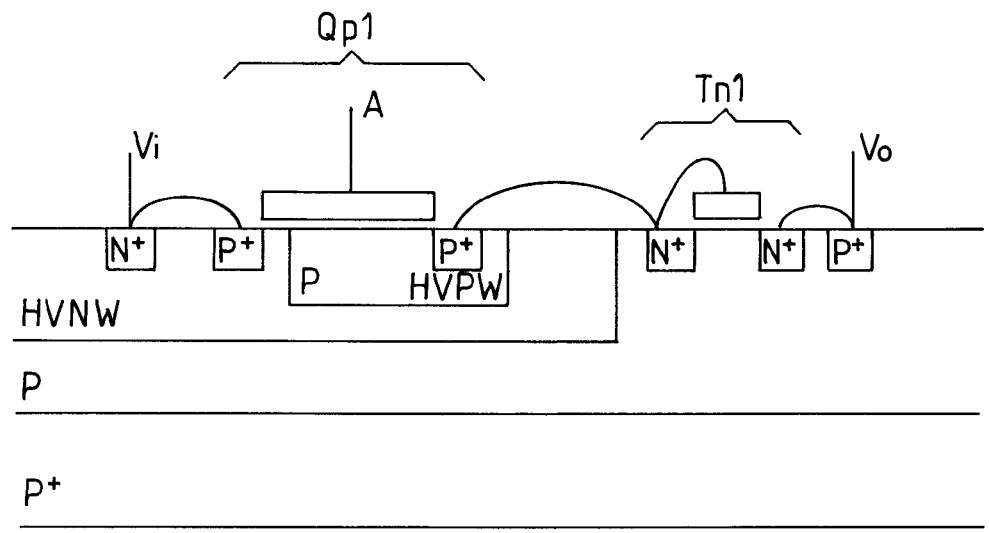

FIG. 7 schematically represents an integrated circuit section illustrating the way in which the logic level translation circuit HBi is produced in practice on the basis of the same diffused deep well HVNW which contains the cell CMi and a part of the circuit BHi. The NMOS transistors such as the transistor Tn1 of FIG. 6 are formed directly in the substrate. The PMOS transistor Qp1 of FIG. 6, comprises a source of type P+, diffused in the well HVNW and linked to the potential $V_i$, and a drain formed by a diffusion of type P+ in a weakly doped P type well HVPW, diffused inside the well HVNW. This well of type P has a boundary situated under the gate of the transistor between the source region and the drain region, and it leaves a channel region of type N adjacent to the source. The channel of this high-voltage transistor of "drift mos" type, overlapped by an insulated gate, therefore in a sense comprises two parts: a well part of type N adjacent to the source and a part of type P adjacent to the drain.

Figures 8, 9:
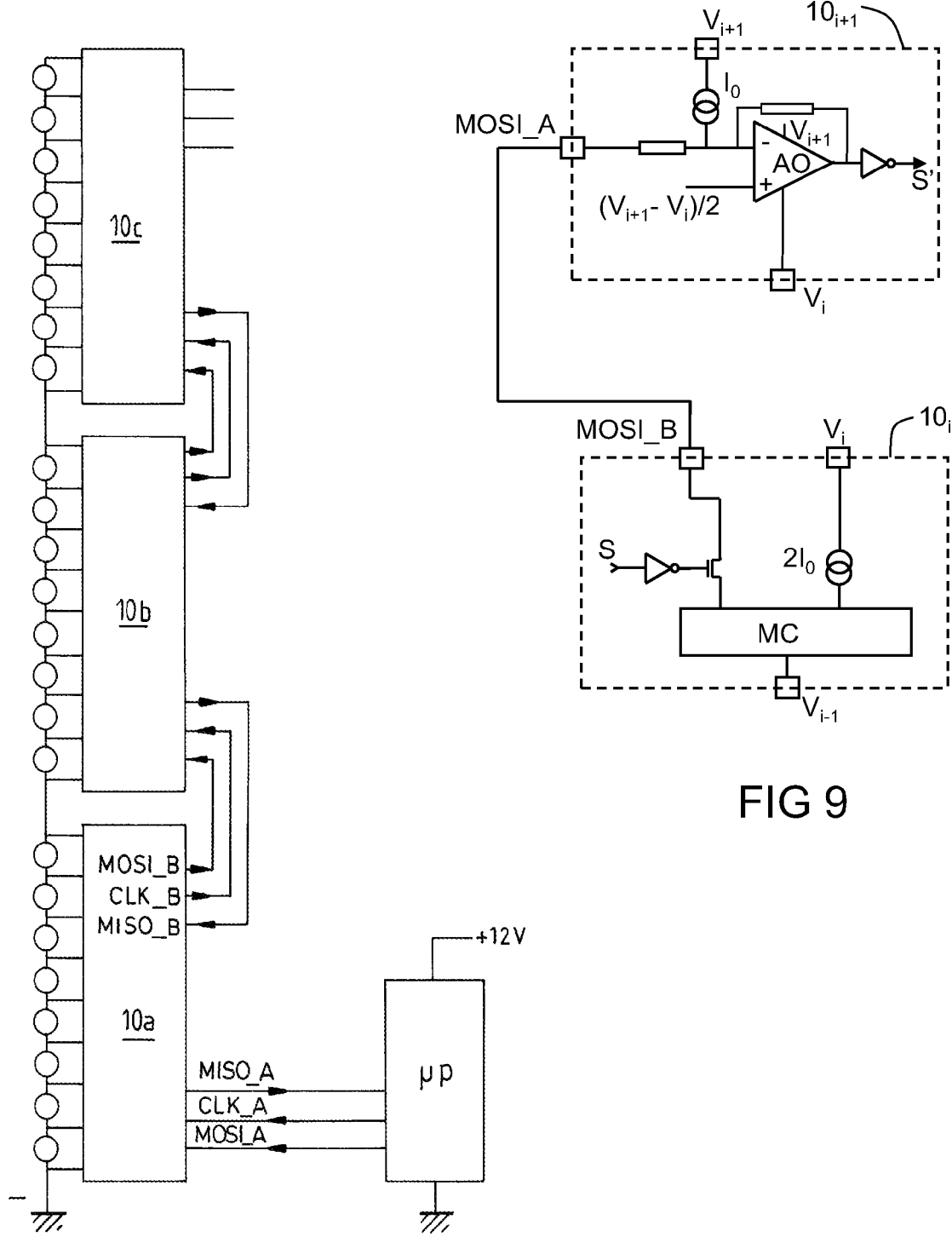
FIG. 8 represents the principle of cascade of control circuits for a set of k.N batteries with k>1.
FIG. 9 represents an example of effecting a signal communication between two adjacent microchips in the cascade.

FIG. 8 represents a cascade setup of three integrated circuits 10a, 10b, 10c for the application to the control of a set of 3 sub-groups of 8 batteries. The three integrated circuits are placed under the general control of a microprocessor (global management circuit) whose main function is to give the various integrated control circuits the necessary voltage measurement commands for individual batteries, which gathers the numerical measurements made in response to these commands, which utilizes them to verify the values in absolute and relative terms, and which gives the discharge commands for individual batteries.

Communication between the circuits is carried out through a bus of SPI ("serial/parallel/interface") type making it possible to connect the circuits in cascade in a mutual master-slave relation where a circuit placed upstream is master and a circuit placed downstream is slave. The microprocessor is master in relation to the first microchip 10a.

Each circuit comprises three connections with an upstream circuit: a connection MOSI_A making it possible to receive digital commands from the upstream master, a clock connection CLK_A making it possible to receive a synchronization clock from the upstream master, and a connection MOSI_B making it possible to transmit digital data in series from the microchip to the upstream master. The initials MOSI and MISO symbolize the expressions Master Out Slave In and Master In Slave Out.

In the same manner each integrated circuit comprises three connections with a downstream circuit: connections MOSI_B and CLK_B for dispatching commands and a synchronization clock to the downstream circuit, connection MISO_B for receiving data therefrom.

The commands dispatched and the data received are accompanied by the address of the integrated circuit for which they are intended or from where they originate. They also include an accurate identification of the measurement and discharge cell which is pertinent to these commands and these data inside an integrated circuit.

The microprocessor which utilizes the data may form part of a set supplied by something other than the set of k.N batteries which is managed by these circuits. It may for example be supplied through a 12-volt battery of the vehicle, independent of the power battery.

The commands and data pass from one circuit to another through the control circuit CC which was mentioned with reference to FIG. 1 (this circuit is essentially a circuit for addressing and routing commands and data, as well as a circuit ensuring the protocols for exchanges on the SPI bus). So that it is possible for the commands, the clock, and the data to pass from one microchip to another although the substrates of adjacent microchips are at very different potentials (the difference is N times the voltage of a battery), a somewhat particular arrangement of level translation circuit is preferably provided, analogous to the arrangement which has already been described, but in which the translation circuit is shared between the two microchips instead of being shared between a substrate and a well. The sharing is done at the location of the drains of a high-voltage MOS transistor whose drain is linked to the drain of a low-voltage complementary transistor. One of the transistors is on a microchip with its drain linked to a connection terminal MOSI or MISO and the other is on the other microchip with its drain linked to a corresponding connection terminal.

Alternatively, provision may be made for specific interface circuits allowing the communication of a signal between two adjacent microchips of the set in cascade.

FIG. 9 represents an exemplary circuit making it possible to transmit a logic signal generated in a microchip 10$i$ to an adjacent microchip 10$i$+1. The first is supplied between a voltage $V_{i-1}$ and a voltage $V_i$ higher than $V_{i-1}$; the second is supplied between a voltage $V_i$ and a voltage $V_{i+1}$ higher than $V_i$. The logic signal is generated on a node S of the first microchip and must be transmitted on a node S' of the second microchip and the communication is carried out via an exterior terminal MOSI_B of the first microchip and an exterior terminal MOSI_A of the second microchip in accordance with the diagram of FIG. 8.

The principle of the transmission is the following: the signal S controls a MOS transistor so as to render it conducting or non-conducting according to its logic level. The MOS transistor is a transistor supporting a high voltage, produced according to the principles set forth above. When it is conducting, it draws a current $2I_0$ (generated by the assembly of a current mirror MC and of a current source $2I_0$) from a terminal such as MOSI_B. When the transistor is not conducting it does not draw a current $2I_0$.

The terminal MOSI_A of the second microchip is linked by a resistor to a negative input (− input) of an operational amplifier AO whose positive input (+input) is brought to a fixed potential equal to $(V_{i+1}-V_i)/2$. The operational amplifier, looped back through a feedback resistor, acts conventionally to maintain its negative input at the potential of its positive input. Its negative input additionally receives the current of a current source of value $I_0$ (half the current value drawn by the MOS transistor of the first microchip). The output S' of the operational amplifier provides the logic signal desired in the second microchip. Inverters can be provided so as to actually obtain a signal S' equal to the signal S rather than complementary to the signal S.

Depending on the state of the signal S, the output S' takes one logic state or another state.

It is seen that in this example, the transmission of the logic signal from a first microchip to a second adjacent microchip is done in the form of a switching of a current between two corresponding terminals of the two microchips by means of a transistor (in the first microchip) supporting a high voltage, the terminals being maintained at a fixed potential with very low impedance by the second microchip. The very low impedance results from the behavior of the operational amplifier of the second microchip which maintains the potential of its negative input at a fixed value (that of the positive input) whatever the value of the current.

In the example of FIG. 9, provision has been made for the positive input of the operational amplifier of the second microchip to be connected to a mean voltage between the supply voltages of the second microchip. Provision could also be made for it to be connected to the voltage $V_i$, that is to say to the supply potential which is common to the two microchips (high potential of the first, low potential of the second).

The circuit can be of the same nature for a communication in the opposite direction, by inverting the voltage and current polarities and the types of transistors (the MOS transistor is an NMOS in the case of communication to a microchip at higher potential). However, for communication in the opposite direction, from a first microchip at higher supply voltage to a second microchip at lower supply voltage, it is preferable to make provision for the positive input of the operational amplifier of the second microchip to be linked to the supply potential common to the two microchips rather than to a mean value between the supply potentials of the second microchip, so as to avoid operating the second microchip with voltages below the potential of the substrate.

In the foregoing, it was considered that the wells are deep diffusions of type N in a P substrate. If the substrate is of type N, it is of course necessary to invert the polarities and the types of doping. Additionally the wells can be defined differently, without different doping from that of the substrate. This is true most particularly of circuits on substrate of SOI type comprising a silicon oxide insulating buried layer. Thick silicon oxide zones surrounding a semiconducting zone and descending as far as the insulating layer make it possible to define wells. This applies to the global wells brought to the low potential of a respective battery and not to the local regions of type N or P serving to constitute the channel and the drain of drift mos transistors; the latter regions remain diffused regions having the indicated doping.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. An electronic circuit for controlling a group of k.N batteries in series, k an integer greater than or equal to 1, and N an integer greater than 1, comprising k integrated control circuit microchips each associated with a sub-group of N batteries in series, wherein:
    each control microchip comprises a substrate connected to an endmost terminal of the set of N batteries, and a control circuit formed in the substrate,
    each microchip comprises N voltage measurement and discharge control cells, each supplied by a respective battery and providing a numerical measurement of the voltage of the battery, each cell being able to receive from the control circuit a control command ordering partial discharge of the battery and to establish a current discharge path in parallel with the battery on receipt of this command,
    each cell, with the exception optionally of a first cell of the sub-group of N batteries, is produced inside a respective well insulated from the substrate of the microchip and insulated from the wells corresponding to the other cells, this well being brought to the potential of one of the terminals of the battery associated with the cell,
    with each cell is associated a voltage level translation circuit so as to allow the transmission of logic levels between a cell supplied through a battery and the control circuit formed in the substrate, the level translation circuit comprising a part formed in the well associated with the cell and a part formed in the substrate.

2. The electronic control circuit as claimed in claim 1, wherein each cell is produced inside a respective well diffused in the substrate.

3. The electronic circuit as claimed in claim 1, wherein the substrate of the microchip is a substrate of type SOI comprising a buried insulating layer, and in that the wells are delimited at their lower part by this layer and at their periphery by insulating zones descending as far as the insulating layer.

4. The electronic circuit as claimed in claim 1, wherein the level translation circuits comprise parts for lowering the common-mode voltage and parts for raising the common-mode voltage of the logic signals.

5. The electronic circuit as claimed in claim 4, wherein the level translation circuit comprises transistors supporting high voltages, comprising a channel divided into two parts between a source region and a drain region, under an insulated gate, a first part comprising a region of type N and a region of type P, one of these regions including a local surface diffusion constituting the drain.

6. The electronic circuit as claimed in claim 1, wherein the control microchip comprises N+1 inputs connected respectively to the terminals of the batteries, three connection terminals for connection to an upstream microchip and three connection terminals for connection to a downstream microchip, each microchip acting as slave in relation to a preceding microchip and as master in relation to a succeeding microchip, with a view to cascade connection of the various microchips for the control of several sets of N batteries.

7. The electronic circuit as claimed in claim 6, wherein the communication of a logic signal between a first microchip and a second microchip is done by switching a current between two corresponding terminals of the two microchips by means of a transistor supporting a high voltage, the terminals being maintained at a fixed potential with very low impedance by the second microchip.

8. The electronic circuit as claimed in claim 2, wherein the level translation circuits comprise parts for lowering the common-mode voltage and parts for raising the common-mode voltage of the logic signals.

9. The electronic circuit as claim in claim 8, wherein the level translation circuit comprises transistors supporting high voltages, comprising a channel divided into two parts between a source region and a drain region, under an insulated gate, a first part comprising a region of type N and a region of type P, one of these regions including a local surface diffusion constituting the drain.

10. The electronic circuit as claimed in claim 3, wherein the level translation circuits comprise parts for lowering the common-mode voltage and parts for raising the common-mode voltage of the logic signals.

11. The electronic circuit as claimed in claim 10, wherein the level translation circuit comprises transistors supporting high voltages, comprising a channel divided into two parts between a source region and a drain region, under an insulated gate, a first part comprising a region of type N and a region of type P, one of these regions including a local surface diffusion constituting the drain.

12. The electronic circuit as claimed in claim 2, wherein the control microchip comprises N+1 inputs connected respectively to the terminals of the batteries, three connection terminals for connection to an upstream microchip and three connection terminals for connection to a downstream microchip, each microchip acting as slave in relation to a succeeding microchip, with a view to cascade connection of the various microchips for the control of several sets of N batteries.

13. The electronic circuit as claimed in claim 3, wherein the control microchip comprises N+1 inputs connected respectively to the terminals of the batteries, three connection terminals for connection to an upstream microchip and three connection terminals for connection to a downstream microchip, each microchip acting as slave in relation to a succeeding microchip, with a view to cascade connection of the various microchips for the control of several sets of N batteries.

14. The electronic circuit as claimed in claim 4, wherein the control microchip comprises N+1 inputs connected respectively to the terminals of the batteries, three connection terminals for connection to an upstream microchip and three connection terminals for connection to a downstream microchip, each microchip acting as slave in relation to a succeeding microchip, with a view to cascade connection of the various microchips for the control of several sets of N batteries.

15. The electronic circuit as claimed in claim 5, wherein the control microchip comprises N+1 inputs connected respectively to the terminals of the batteries, three connection terminals for connection to an upstream microchip and three connection terminals for connection to a downstream microchip, each microchip acting as slave in relation to a succeeding microchip, with a view to cascade connection of the various microchips for the control of several sets of N batteries.

* * * * *